United States Patent [19]

Cheung et al.

[11] 4,257,057
[45] Mar. 17, 1981

[54] SELF-MULTIPLEXED MONOLITHIC INTRINSIC INFRARED DETECTOR

[75] Inventors: Derek T. Cheung; A. Mike Andrews, II; Joseph T. Longo, all of Thousand Oaks, Calif.

[73] Assignee: Rockwell International Corporation, El Segundo, Calif.

[21] Appl. No.: 36,885

[22] Filed: May 7, 1979

[51] Int. Cl.³ ............... H01L 29/78; H01L 29/205; H01L 27/14; H01L 31/00
[52] U.S. Cl. ......................... 357/24; 357/16; 357/30; 357/61; 307/221 D; 250/338; 250/370
[58] Field of Search ............... 357/24, 30, 16; 307/221 D, 311; 250/338, 370

[56] References Cited

U.S. PATENT DOCUMENTS

| 4,142,198 | 2/1979 | Finnila et al. | 357/24 |
| 4,176,369 | 11/1979 | Nelson et al. | 357/24 |

FOREIGN PATENT DOCUMENTS 2712479 10/1977 Fed. Rep. of Germany ............ 357/24
1532859 11/1978 United Kingdom ..................... 357/24

*Primary Examiner*—Gene M. Munson
*Attorney, Agent, or Firm*—H. Frederick Hamann; Craig O. Malin

[57] ABSTRACT

In this monolithic detector array, a signal processing layer is epitaxially formed directly on an active detector layer. The active detector layer is supported by a transparent substrate. The three layers are made of intrinsic semiconductors of the same conductivity type (e.g., n-type). The semiconductor forming the active layer has a smaller bandgap than the signal processing and substrate layers. A plurality of vias of opposite conductivity type (e.g, p-type) extend through the signal processing layer into the active detector layer where they form p-n junctions with the active detector layer. These p-n junctions collect charges generated by the radiation and the vias conduct these charges to the signal processing layer where gates, AC background suppression circuitry, and a charge coupled device process the photogenerated signals.

2 Claims, 4 Drawing Figures

SELF-MULTIPLEXED MONOLITHIC INTRINSIC INFRARED DETECTOR

STATEMENT OF GOVERNMENT INTEREST

The invention herein described was made in the course of or under a contract or subcontract thereunder with the Department of Defense.

BACKGROUND OF THE INVENTION

1. Field of the Invention

This invention relates to the field of solid state electronics, particularly to solid state detector arrays.

2. Description of the Prior Art

Focal planes used for detecting radiation require arrays of detectors which are constructed of special semiconductors that are sensitive to the wavelength being detected. Previous focal planes have used discrete detectors in linear arrays. The cost of these arrays, however, on a per detector channel basis has been high, reflecting the low yields associated with detector fabrication, number of associated parts, and the critical hand wiring involved. Additionally, as the requirement for the number of detectors increase, this approach is ultimately limited in performance by the relatively large size of discrete detectors, interconnect complexity, and power dissipation.

One approach taken to overcome the limitations of discrete detectors is to integrate the detector and signal processing functions on-chip. This approach, based upon the charge transfer concept, makes possible high density self-scanned infrared arrays with integral low noise readout. The use of charge transfer devices allows signals from a large number of detectors to be multiplexed on-chip and read out through a single output amplifier, thereby reducing the parts count and interconnect complexity and making possible arrays with thousands of individual detectors.

One class of integrated arrays, monolithic extrinsic arrays, utilizes an extrinsic substrate (silicon or germanium) to provide sensitivity to radiation. The resultant signal charge is injected into a lightly doped epitaxial layer for charge transfer multiplexing and readout. Although monolithic extrinsic arrays offer the advantages of integrated construction, they have relatively low quantum efficiency, high operating temperature, and high crosstalk.

A second class of integrated arrays, hydrid arrays, employs separate sensing and charge transfer media. The detector array, fabricated in an efficient photosensitive material, is electrically and mechanically coupled to a silicon charge coupled device (CCD) multiplexer (see, for example, U.S. Pat. No. 4,067,104 to John Tracy). Such hybrid design permits optimum selection of materials for both the detecting and signal processing functions. However, it requires a large number of fragile interconnects and an efficient input circuit to inject the detector signal into the silicon CCD multiplexer.

SUMMARY OF THE INVENTION

It is an object of the invention to provide a self-multiplexed, high density detector array.

It is an object of the invention to provide a self-multiplexed high density detector array tuned to a predetermined spectral response by means of an intrinsic semiconductor.

It is an object of the invention to provide a multilayer monolithic intrinsic semiconductor detector array.

It is an object of the invention to provide a self-multiplexed detector array having high quantum efficiency and low crosstalk.

It is an object of the invention to provide an improved, self-multiplexed, backside illuminated infrared (IR) focal plane.

It is an object of the invention to provide a reliable, high density array of intrinsic semiconductor detectors which has higher operating temperature capabilities than extrinsic semiconductor detectors.

According to the invention, a multiplexer or charge coupled device (CCD) is formed in a signal processing layer which is grown directly on a detector array. The multiplexer is electrically coupled to discrete p-n junctions in an active layer of the detector array by p- type conductivity vias (for n- type conductivity semiconductors). Photocurrent generated in the active layer flows to the nearest p-n junction and up the vias where it is transferred into a CCD channel in the signal processing layer by means of an electrode (gate) system.

In a preferred embodiment, the array has three layers of n- type conductivity intrinsic semiconductors. Radiation enters the array through a substrate layer which is transparent to the radiation being measured. An active layer on top of the substrate layer absorbs the radiation and generates charges. The third layer is a signal processing layer epitaxially formed on top of the active layer. P- type vias extend through the signal processing layer into the active layer where they form p-n junctions with the n-type active layer.

Heterojunctions on both sides of the active layer confine the minority carriers to the active layer. The energy bandgap of the active layer is selected to make it sensitive to the wavelength of the radiation being detected. The substrate layer bandgap is made larger than the active layer bandgap so that it is transparent to the radiation. The signal processing layer also has a bandgap larger than the active layer to permit operation at relatively high temperature and at relatively high breakdown voltage.

An insulating layer covers the signal processing layer. Two levels of overlapping gates in the insulating layer adjacent the top of the wells control the transfer of signals from the vias into an AC coupling circuit in the signal processing layer which serves to suppress the DC background and thereby utilizes the full dynamic range of the CCD multiplexer.

These and other objects and features of the invention will be apparent from the following detailed description, taken with reference to the accompanying drawings.

DESCRIPTION OF THE PREFERRED EMBODIMENT

Figure 1:
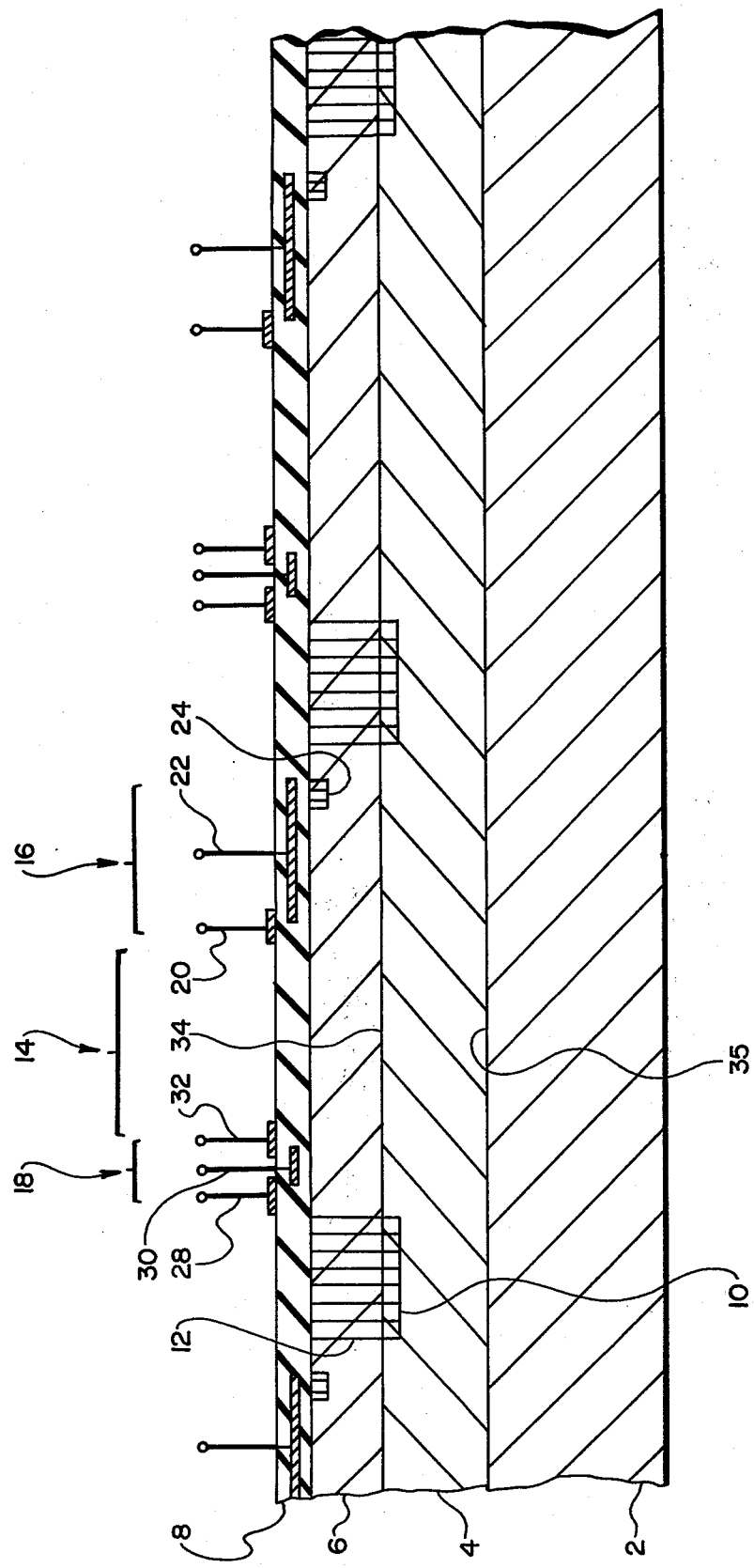
FIG. 1 is a schematic, cross-section of a self-multiplexed detector array according to the invention.

As shown in FIG. 1, the self-multiplexed detector array has three intrinsic semiconductor layers 2, 4, 6 and one insulation layer 8. The radiation being measured enters through transparent substrate layer 2 providing high detector fill capacities because the device is backside illuminated and the detectors are not obscured by the signal processing structure. Photocurrent is generated throughout active layer 4 by absorption of the radiation. Since active layer 4 is an intrinsic semiconductor, high quantum efficiency is obtained in the generation of the photocurrent. This photocurrent is collected at p-n junction 10 and flows up opposite-type conductivity vias 12 into signal processing layer 6. Thus, the p-n junction 10 formed by each via 12 functions as an individual detector in each array, and the via itself functions as an interconnect between the individual detectors in active layer 6 and the signal processing circuit 14, 16. The vias 12 are wells of opposite conductivity material formed in layers 4, 6 by known p-n junction formation techniques such as ion implantation or diffusion (of donor elements (for n-type) and acceptor elements (for p-type)). Where the wells or vias 12 terminate in active layer 4, p-n junctions 10 are created.

An input gate system 18 is used to transfer signals from vias 12 into signal processing circuit 14, 16. In the embodiment shown in FIG. 1, gate system 18 is two levels of overlapping gates in insulator layer 8.

Signal processing circuit 14, 16 comprises a backgroun suppression circuit 14 and a charge coupled device (CCD) multiplexer 16. The design fabrication and utilization of these signal processing gates and circuits are known in the art, and various embodiments can be used depending upon the particular application. For example, FIG. 1 shows a surface CCD multiplexer 16 comprising transfer gate 20, channel gate 22, and implanted channel stop 24. However, a buried channel CCD multiplexer could also be utilized within the current state of the art. Likewise, background suppression circuit 14 is a known circuit such as one of the AC coupling circuit described by G. C. Temes and D. T. Cheung (the present inventor) in U.S. Patent Application Ser. No. 868,946 filed Jan. 12, 1978.

Figure 2:
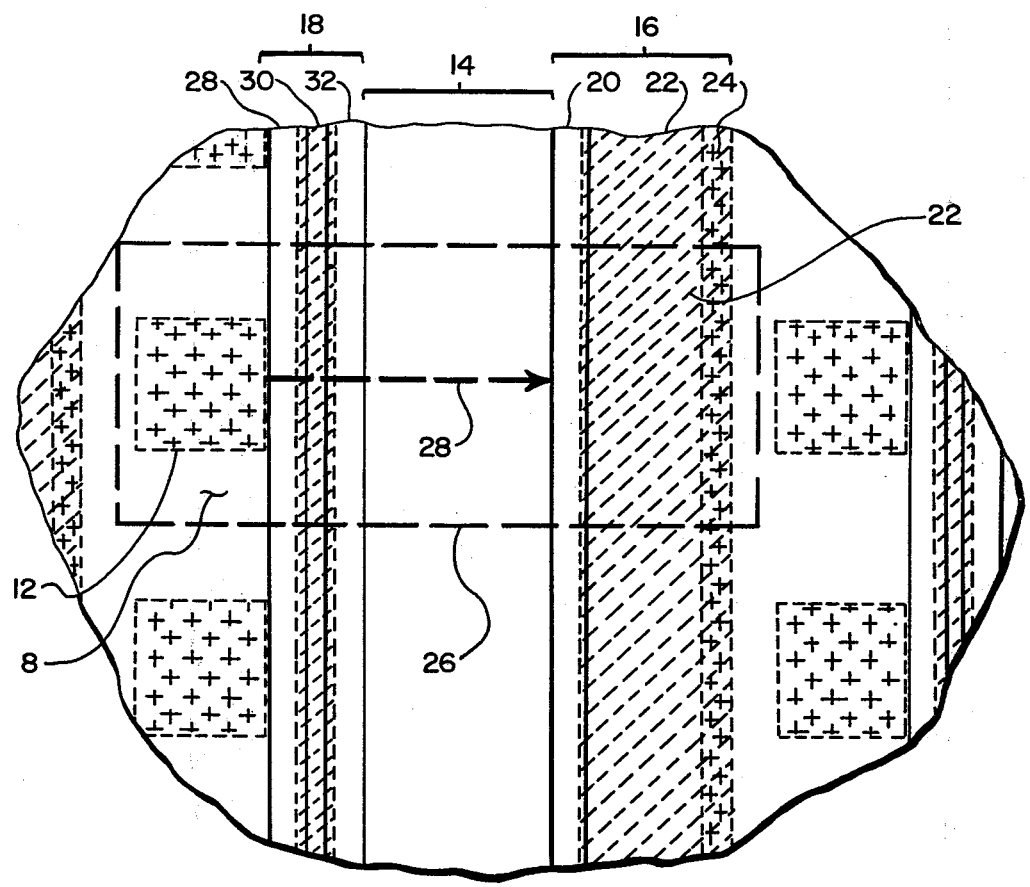
FIG. 2 is a schematic top view of the detector array shown in FIG. 1.

A schematic top view of the self-multiplexed detector array is shown in FIG. 2. A unit cell of the array, which repeats throughout the monolith, is enclosed by the dashed lines forming box 26. Dashed arrow 28 shows the direction of flow of signals from vias 12 under insulation layer 8 into CCD 16. Input gate 18 consists of three overlapping gates 28, 30, 32, with the middle gate 30 being embedded inside oxide layer 8. These gates 28, 30, 32 control the input of signals into background suppression circuit 14. Transfer gate 20 controls the transfer of the signal into the channel of CCD formed by gate 22 and implanted channel stop 24.

The semiconductor forming layers 2, 4, 6 are intrinsic semiconductors of the same conductivity type. Active layer 4 has an energy bandgap that is selected to be sensitive to the wavelength of the radiation being detected according to the well known relation: $\lambda = 1.239/E_g$, where $\lambda$ is the threshold wavelength on the long wavelength side in $\mu$m and $E_g$ is the energy gap of the active layer in eV. Substrate layer 2 has a larger bandgap than active layer 4 so that it is transparent to the radiation detected by active layer 4. Signal processing layer 6 is epitaxial with respect to active layer 4 and also has a larger bandgap. The larger the bandgap of signal processing layer 6, the higher its operating temperature, the higher its breakdown voltage, the larger its charge storage capacity, and the lower its dark current.

Figure 3:
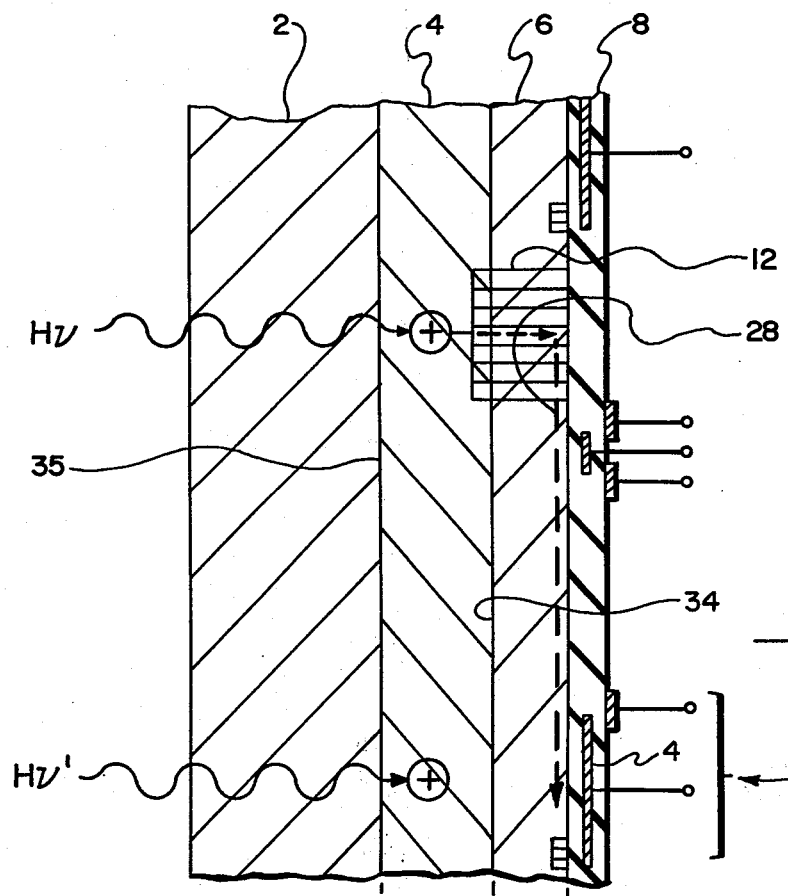
FIG. 3 is a portion of the cross-section of FIG. 1 showing electrons being generated by radiation entering the array in two different locations.
Figure 4:
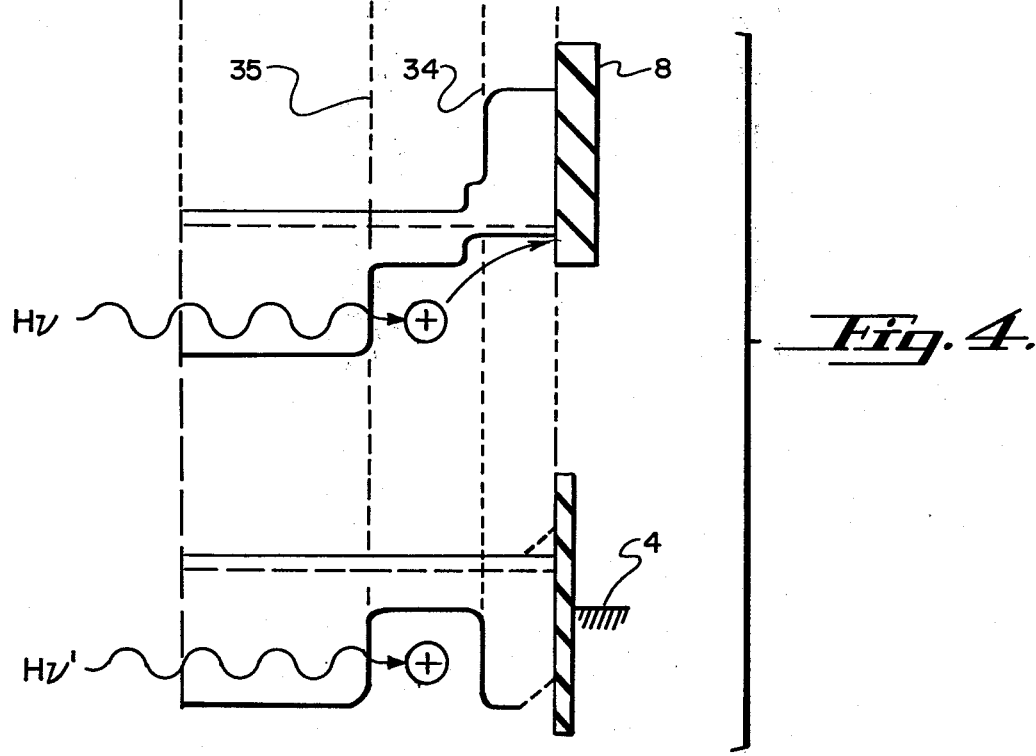
FIG. 4 shows energy bandgap diagrams for the two locations shown in the corresponding FIG. 3.

The heterojunction energy barriers 34, 35 formed on each side of active layer 4 by the substrate and signal processing layers 2, 6 confine minority carries in active layer 4 as shown in FIGS. 3 and 4. This enhances the collection efficiency of vias 12 and prevents optical cross talk between active layer 4 and CCD channel 16 in signal processing layer 6. Radiation, $H_v$, absorbed in an n-type conductivity active layer 4 generates positive minority carriers which drift to the nearest p-type conductivity via 12 where they are collected and sent through the signal processing layer 6 as shown by dashed arrow 28. Minority carriers generated in active layer 4 under CCD channel 16 by radiation $H_v'$ are prevented by heterojunction 34 from flowing directly into CCD channel 16, and are prevented by heterojunction 35 from flowing into substrate 2. Rather, the carriers flow laterally in active layer 4 for collection at the nearest p-n junction 10.

The selection of intrinsic semiconductors for the layers is dictated by spectral and bandgap requirements, as noted above, and by the requirement that the lattices be sufficiently matched to form heterojunctions 34, 35. In particular, heterojunction 34 between active layer 4 and signal processing layer 6 must be epitaxial, thus requiring a close lattice match between the semiconductors forming these two layers. If necessary, buffer layers and grading of the layer's compositions can be utilized to obtain suitable spectral response and lattice matching. The state of the art is sufficiently advanced so that the artisan can select suitable materials to meet these requirements.

The spectral response of the detector layer is tuneable because intrinsic ternary alloy semiconductors are known having bandgaps which vary as a function of alloy composition. Examples of materials used to construct the self-multiplexed detector array of the invention are as follows:

EXAMPLE I

| Layer | General Formula | Specific Formula | Thickness |
|---|---|---|---|
| Substrate | $(Ga_{1-x}In_x)Sb$ | GaSb | 200 $\mu$m |
| Active | $In(As_{1-y}Sb_y)$ | $In(As_{.9}Sb_{.1})$ | 5 $\mu$m |
| Signal Processing | $(Ga_{1-z}In_z)Sb$ | GaSb | 5 $\mu$m |
| Insulation | $SiO_2$ | $SiO_2$ | 2000 A |

The wavelength of radiation detected by the detector array having the specific formula of Example I is 1.6 to 4.2 $\mu$m. The operating temperature of the detector is approximately 195° K.

EXAMPLE II

| Layer | General Formula | Specific Formula | Thickness |
|---|---|---|---|
| Substrate | $(Ga_{1-x}In_x)Sb$ | $(Ga_{.5}I_{.5})Sb$ | 200 $\mu$m |
| Active | $In(As_{1-y}Sb_y)$ | $In(As_{.35}Sb_{.65})$ | 5 $\mu$m |
| Signal Processing | $(Ga_{1-z}In_z)Sb$ | $(Ga_{.5}In_{.5})Sb$ | 5 $\mu$m |
| Insulation | $SiO_2$ | $SiO_2$ | 2000 A |

The wavelength of radiation detected by the detector array having the specific formula of Example II is 2.7 to 9 μm. The operating temperature of the detector is approximately 77° K.

EXAMPLE III

| Layer | General Formula | Specific Formula | Thickness |
|---|---|---|---|
| Substrate | $(Ga_{1-x}Al_x)Sb$ | $(Ga_{.8}Al_{.2})Sb$ | 200 μm |
| Active | $Ga_{1-y}Sb_y$ | Ga | 5 μm |
| Signal Processing | $(Ga_{1-z}Al_z)Sb$ | $(Ga_{.8}Al_{.2})Sb$ | 5 μm |
| Insulation | $SiO_2$ | $SiO_2$ | 2000 A |

The wavelength of radiation detected by the detector array having the specific formula of Example III is 1.1 to 1.6 μm. The operating temperature of the detector is approximately room temperature.

Numerous variations and modifications may be made without departing from the present invention. For example, the conductivity type of the semiconductors could be changed so that p-type layers are used with n-type vias. Accordingly, it should be clearly understood that the form of the invention described above and shown in the accompanying drawings is illustrated only and is not intended to limit the scope of the present invention.

What is claimed is:

1. A self-multiplexed detector array comprising:
   a first conductivity type, intrinsic semiconductive substrate of $Ga_{(1-x)}In_xSb$ which is transparent to radiation,
   a first conductivity type, intrinsic semiconductive active layer of $InAs_{(1-y)}Sb_y$ deposited on said substrate to form a heterojunction between said substrate and said active layer;
   a first conductivity type, intrinsic semiconductive signal processing layer of $Ga_{(1-z)}In_zSb$ epitaxially deposited on said active layer to form a heterojunction between said active layer and said signal processing layer, said signal processing layer having signal processing circuitry fabricated thereon, said signal processing layer and said substrate having a larger bandgap than said active layer;
   a plurality of vias of a second conductivity type extending through said signal processing layer into said active layer and forming a plurality of p-n homojunctions in said active layer between said first conductivity type active layer and said second conductivity type vias, said p-n homojunctions forming the detector array;
   an insulating layer of $SiO_2$ on said signal processing layer; and
   an input gate on said insulating layer adjacent each via for controlling the input charge from each via into said signal processing circuitry, whereby radiation entering said substrate is converted into electrical signals and processed on a single monolith.

2. A self-multiplexed detector array comprising:
   a first conductivity type, intrinsic semiconductive substrate of $Ga_{(1-x)}Al_xSb$ which is transparent of radiation,
   a first conductivity type, intrinsic semiconductive active layer of $Ga_{(1-y)}Sb_y$ deposited on said substrate to form a heterojunction between said substrate and said active layer;
   a first conductivity type, intrinsic semiconductive signal processing layer of $Ga_{(1-z)}Al_zSb$ epitaxially deposited on said active layer to form a heterojunction between said active layer and said signal processing layer, said signal processing layer having signal processing circuitry fabricated thereon, said signal processing layer and said substrate having a larger bandgap than said active layer;
   a plurality of vias of a second conductivity type extending through said signal processing layer into said active layer and forming a plurality of p-n homojunctions in said active layer between said first conductivity type active layer and said second conductivity type vias, said p-n homojunctions forming the detector array;
   an insulating layer of $SiO_2$ on said signal processing layer; and
   an input gate on said insulating layer adjacent each via for controlling the input charge from each via into said signal processing circuitry, whereby radiation entering said substrate is converted into electrical signals and processed on a single monolith.

* * * * *